United States Patent
Monteiro Diniz Reis et al.

(10) Patent No.: US 12,266,685 B2
(45) Date of Patent: Apr. 1, 2025

(54) METHOD AND DEVICE FOR USING A SEMICONDUCTOR COMPONENT

(71) Applicant: Robert Bosch GmbH, Stuttgart (DE)

(72) Inventors: Daniel Monteiro Diniz Reis, Esslingen Am Neckar (DE); Frank Schatz, Kornwestheim (DE); Mathias Mews, Reutlingen (DE); Timo Schary, Aichtal-Neuenhaus (DE)

(73) Assignee: ROBERT BOSCH GMBH, Stuttgart (DE)

( * ) Notice: Subject to any disclaimer, the term of this patent is extended or adjusted under 35 U.S.C. 154(b) by 633 days.

(21) Appl. No.: 17/564,645

(22) Filed: Dec. 29, 2021

(65) Prior Publication Data
US 2022/0216298 A1 Jul. 7, 2022

(30) Foreign Application Priority Data
Jan. 4, 2021 (DE) .................. 10 2021 200 003.7

(51) Int. Cl.
*H01L 23/495* (2006.01)
*H01L 49/02* (2006.01)

(52) U.S. Cl.
CPC .............. *H01L 28/75* (2013.01); *H01L 28/55* (2013.01)

(58) Field of Classification Search
CPC ................................ H01L 28/75; H01L 28/55
See application file for complete search history.

(56) References Cited

U.S. PATENT DOCUMENTS

| | | | | |
|---|---|---|---|---|
| 6,153,978 | A * | 11/2000 | Okamoto | H01J 3/022 |
| | | | | 315/169.3 |
| 10,062,522 | B1 * | 8/2018 | Phillips | H01G 11/62 |
| 11,530,952 | B2 * | 12/2022 | Khazeni | G01J 3/2803 |
| 2008/0018611 | A1 * | 1/2008 | Serban | H03K 17/975 |
| | | | | 345/173 |

(Continued)

OTHER PUBLICATIONS

J. Wang, C. Salm, E. Houwman, M. Nguyen and J. Schmitz, "Humidity and polarity influence on MIM PZT capacitor degradation and breakdown," 2016 IEEE International Integrated Reliability Workshop (IIRW), South Lake Tahoe, CA, 2016, pp. 65-68, doi: 10.1109/IIRW.2016.7904903.

*Primary Examiner* — Nathan W Ha
(74) *Attorney, Agent, or Firm* — NORTON ROSE FULBRIGHT US LLP; Gerard A. Messina (57) ABSTRACT

Device and method for using a semiconductor component in which a dielectric layer is situated between a first electrode and a second electrode of the semiconductor component, defects of a first defect type being present in the dielectric layer. The method includes: operating the semiconductor component using a first voltage having a first polarity between the first electrode and the second electrode, determining whether or not a condition is met for switching over from operating the semiconductor component using the first voltage to operating the semiconductor component using a second voltage, which has a second polarity opposite the first polarity, continuing the operation of the semiconductor component using the first voltage if the condition is not met, and otherwise ending the operation of the semiconductor component using the first voltage, and operating the semiconductor component using the second voltage between the first electrode and the second electrode.

15 Claims, 6 Drawing Sheets

(56) References Cited

U.S. PATENT DOCUMENTS

| | | | |
|---|---|---|---|
| 2010/0277524 A1* | 11/2010 | Morita | B41J 2/04581 310/317 |
| 2012/0039114 A1* | 2/2012 | Bratkovski | H01G 4/255 365/149 |
| 2012/0217171 A1* | 8/2012 | Wurzinger | H04R 1/04 204/406 |
| 2013/0203258 A1* | 8/2013 | Chen | H01J 37/32495 156/345.43 |
| 2014/0273300 A1* | 9/2014 | Pramanik | H10N 70/883 438/382 |
| 2015/0016227 A1* | 1/2015 | Brock-Fisher | G01N 29/2406 367/181 |
| 2016/0093625 A1* | 3/2016 | Rui | H01L 28/75 257/532 |
| 2016/0099303 A1* | 4/2016 | Phatak | H01L 28/65 257/532 |
| 2016/0133691 A1* | 5/2016 | Phatak | H01L 28/75 257/532 |
| 2017/0154908 A1* | 6/2017 | Tashiro | H04N 25/77 |
| 2018/0097056 A1* | 4/2018 | Goh | H01L 28/75 |
| 2018/0219047 A1* | 8/2018 | Tokuhara | H10K 30/353 |
| 2019/0256904 A1* | 8/2019 | Davis | G01N 33/48721 |
| 2019/0393298 A1* | 12/2019 | Lin | H01L 23/5223 |
| 2020/0273867 A1* | 8/2020 | Manipatruni | G11C 11/2257 |
| 2020/0328220 A1* | 10/2020 | Derner | H01L 23/528 |
| 2020/0328271 A1* | 10/2020 | Gambino | H01L 28/75 |
| 2020/0350323 A1* | 11/2020 | Karda | H01L 28/75 |
| 2020/0350371 A1* | 11/2020 | Pellizzer | H10N 70/841 |
| 2021/0074805 A1* | 3/2021 | Lin | H01L 23/5223 |
| 2021/0091097 A1* | 3/2021 | Mennenga | H10B 53/20 |
| 2021/0104596 A1* | 4/2021 | Zelner | H01L 21/02282 |
| 2021/0159048 A1* | 5/2021 | Parimi | H01J 37/32174 |
| 2021/0202690 A1* | 7/2021 | Thareja | H01L 28/56 |
| 2021/0336132 A1* | 10/2021 | Lee | H10N 70/801 |
| 2021/0384751 A1* | 12/2021 | Takahashi | H02J 7/007182 |
| 2022/0069541 A1* | 3/2022 | Tossoun | H01S 5/0261 |
| 2022/0102483 A1* | 3/2022 | Sounart | H01L 28/75 |
| 2022/0113346 A1* | 4/2022 | Nuttgens | G01R 31/275 |
| 2022/0140066 A1* | 5/2022 | Lee | H01L 28/56 257/532 |
| 2022/0199519 A1* | 6/2022 | Lin | H01L 28/60 |
| 2022/0199758 A1* | 6/2022 | Sen Gupta | H01L 28/60 |
| 2022/0270830 A1* | 8/2022 | Sharma | H01G 11/36 |
| 2022/0302007 A1* | 9/2022 | Gangal | H01L 24/16 |
| 2023/0201830 A1* | 6/2023 | Gila | F04B 19/006 204/451 |
| 2024/0161669 A1* | 5/2024 | Lu | G09G 3/3677 |

* cited by examiner

METHOD AND DEVICE FOR USING A SEMICONDUCTOR COMPONENT

FIELD

The present invention relates to a method and a device for using a semiconductor component.

BACKGROUND INFORMATION

Such a semiconductor component may contain a dielectric layer including defects. In the intended operation of the semiconductor component, the defects may migrate in the dielectric layer between electrodes of the semiconductor component. The defects may accumulate at one of the electrodes. A dielectric breakthrough may thus occur at this electrode, which shortens the service life of the semiconductor component.

After a dielectric breakthrough, a function of the semiconductor component may be reestablished under certain conditions. This is described, for example, in J. Wang, C. Salm, E. Houwman, M. Nguyen and J. Schmitz, "Humidity and polarity influence on MIM PZT capacitor degradation and breakdown," 2016 IEEE International Integrated Reliability Workshop (IIRW), South Lake Tahoe, C A, 2016, pp. 65-68, doi: 10.1109/IIRW.2016.7904903.

SUMMARY

A method and a device in accordance with the present invention may enable a use of this property to extend the lifetime of the semiconductor component.

In accordance with an example embodiment of the present invention, the method for using a semiconductor component in which a dielectric layer is situated between a first electrode and a second electrode of the semiconductor component, defects of a first defect type being present in the dielectric layer, includes the steps of operating the semiconductor component using a first voltage having a first polarity between the first electrode and the second electrode, determining whether or not a condition is met for switching over from operating the semiconductor component using the first voltage to operating the semiconductor component using a second voltage, which has a second polarity opposite to the first polarity, continuing the operation of the semiconductor component using the first voltage if the condition is not met, and otherwise ending the operation of the semiconductor component using the first voltage, and operating the semiconductor component using the second voltage between the first electrode and the second electrode. In the intended operation of the semiconductor component using the first voltage, a reversion process is thus reliably started before a dielectric breakthrough shortening the lifetime of the semiconductor component occurs.

In accordance with an example embodiment of the present invention, the method preferably includes the steps of determining whether or not a condition is met for switching over from operating the semiconductor component using the second voltage to operating the semiconductor component using the first voltage, continuing the operation of the semiconductor component using the second voltage if the condition is not met, and otherwise ending the operation of the semiconductor component using the second voltage, and operating the semiconductor component using the first voltage between the first electrode and the second electrode. This enables a continuous operation of the semiconductor component using the intended first voltage and including interposed reversion process.

In accordance with an example embodiment of the present invention, a duration of the operation of the semiconductor component using the second voltage is preferably determined, the condition for switching over from operating the semiconductor component using the second voltage to operating the semiconductor component using the first voltage is met if the duration exceeds a limiting value, which is defined by a time period in which the second voltage causes a movement of defects of the first defect type in a predefined position in the dielectric layer in the direction toward the second electrode.

In accordance with an example embodiment of the present invention, a leakage current is preferably determined during the operation of the semiconductor component using the second voltage, the condition for switching over from operating the semiconductor component using the second voltage to operating the semiconductor component using the first voltage being met if the leakage current exceeds or falls below a threshold.

In accordance with an example embodiment of the present invention, a duration of the operation of the semiconductor component using the first voltage is preferably determined, the condition for switching over from operating the semiconductor component using the first voltage to operating the semiconductor component using the second voltage being met when the duration exceeds a limiting value.

A leakage current which flows in the operation of the semiconductor component using the first voltage is preferably determined, the condition for switching over from operating the semiconductor component using the first voltage to operating the semiconductor component using the second voltage being met when the leakage current exceeds a threshold.

The semiconductor component is preferably heated during the operation of the semiconductor component using the second voltage.

The semiconductor component is preferably heated during the operation of the semiconductor component using the second voltage to a temperature which is higher than a temperature of the semiconductor component during the operation of the semiconductor component using the first voltage.

The semiconductor component is preferably heated during the operation of the semiconductor component using the second voltage to a temperature in a range of 100° C. to 250° C., preferably to a temperature of 150° C. or 200° C. A higher voltage or temperature causes a shorter time of the reversion process. The shortening of the duration is not linearly related to the increase of the temperature or the increase of the second voltage. An excessively high second voltage or temperature may cause destruction of the second electrode, for example, due to accumulation there. The accumulation reduces the Schottky barrier and a dielectric breakthrough may occur. In the case of a lower voltage in relation thereto, at equal temperature, the threshold value of the defect density which results in the breakthrough is higher. This means the temperature may be selected to be higher with decreasing second voltage, without a dielectric breakthrough occurring. The temperature is a good parameter to set the speed of the movement of the defects.

In accordance with an example embodiment of the present invention, in operation using the first voltage, the semiconductor component preferably drives an actuator, in particular a MEMS, a micromirror, a print head, or a loudspeaker, the actuator not being driven by the semiconductor component in operation using the second voltage, in particular in an idle state of a device.

The semiconductor component may be operated using a second voltage higher than the first voltage.

In accordance with an example embodiment of the present invention, the device includes the semiconductor component, which includes a dielectric layer between a first electrode and a second electrode of the semiconductor component, defects of a first defect type being present in the dielectric layer, and a regulating and/or control unit which is designed to carry out steps in the method.

The dielectric layer may include defects of at least one further defect type which are movable in the direction toward the second electrode upon application of the first voltage.

Further advantageous specific embodiments result from the following description and the figures.

DETAILED DESCRIPTION OF EXAMPLE EMBODIMENTS

Figure 1:
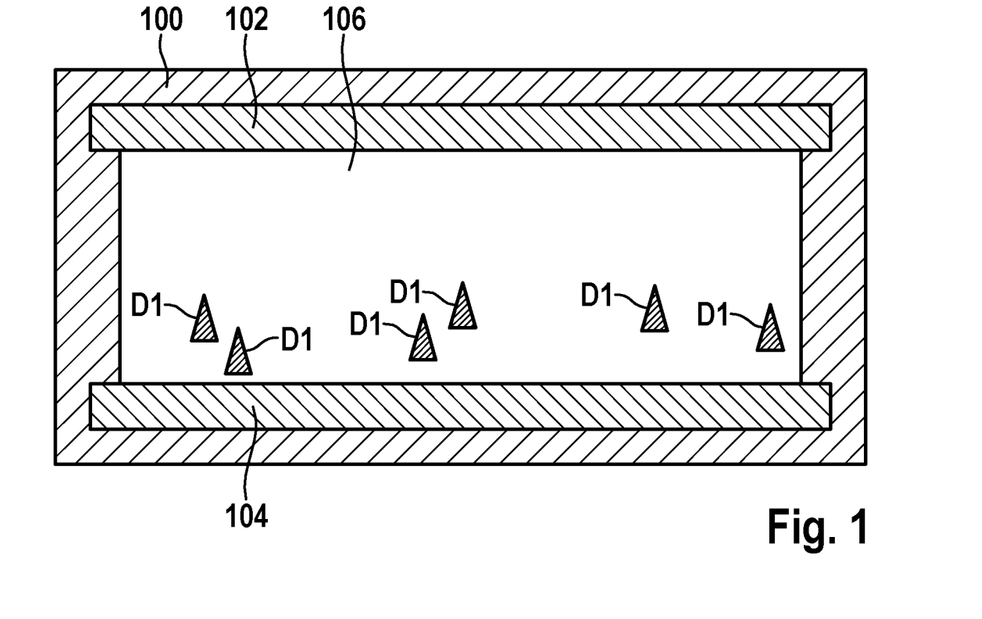
FIG. 1 shows a schematic representation of a first embodiment of a semiconductor component, in accordance with the present invention.

FIG. 1 shows a schematic representation of a semiconductor component 100 according to a first embodiment. Semiconductor component 100 includes a first electrode 102, a second electrode 104, and a dielectric layer 106.

Dielectric layer 106 is situated between first electrode 102 and second electrode 104. In the example, first electrode 102 and second electrode 104 are situated on mutually opposing sides of dielectric layer 106.

Defects D1 of a first defect type are present in the dielectric layer. These defects D1 are situated in a first starting position in the example. The first starting position is defined in the example by a manufacturing process of dielectric layer 106. Defects D1 are in particular situated closer to second electrode 104 than to first electrode 102.

Figure 2:
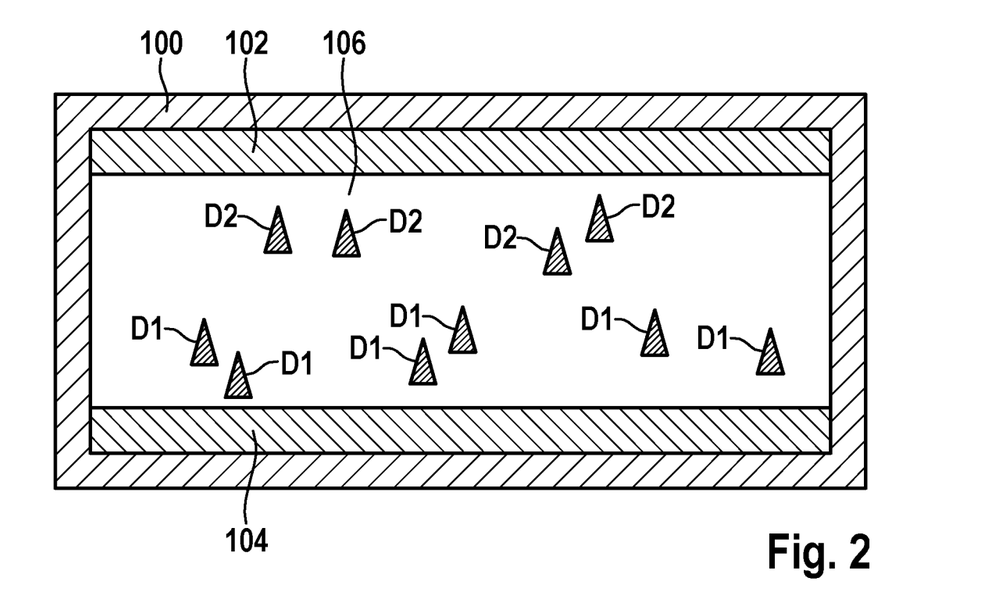
FIG. 2 shows a schematic representation of a second embodiment of a semiconductor component, in accordance with the present invention.

FIG. 2 shows a schematic representation of semiconductor component 100 according to a second embodiment. Semiconductor component 100 according to the second embodiment is designed like semiconductor component 100 according to the first embodiment. In contrast to the first embodiment, in the second embodiment, defects of a second defect type are additionally present in the dielectric layer.

These defects D2 are situated in a second starting position in the example. The second starting position is defined in the example by a manufacturing process of dielectric layer 106.

Defects D2 are situated in the example at a different position than defects D1. Defects D2 are in particular situated closer to first electrode 102 than to second electrode 104.

Defects D1 of the first defect type and defects D2 of the second defect type are charged defects which move in the event of an applied potential between first electrode 102 and second electrode 104 in accordance with their charge to a particular interface between dielectric layer 106 and either first electrode 102 or second electrode 104. The interface is referred to hereinafter as the "interface." This transport of the charged defects is determined by defect properties and a "hopping mechanism."

Hopping mechanism in this context means that a displacement, i.e., a hopping, of the defects takes place in an electrical field E caused by particular applied voltage U in dielectric layer 106 of thickness d. The defects of a defect type i move along localized defect states having a mean effective distance al. This results in a speed $v_i$ of the movement of the defects of defect type i. Speed $v_i$ is described via the conventional approach of variable range hopping:

$$v_i = C_{0,i}(a_i) e^{-\frac{E_{A,0,i}}{k_B T}} \sinh\left(\frac{N_{q,i} a_i E}{k_B T}\right) \text{ where } E = \frac{U}{d}$$

$$C_{0,i}(a_i) = v_0 a_i e^{-\frac{2a_i}{\alpha}}$$

In this case, $C_{0,i}(a_i)$ represents a function which represents an influence of a local defect distribution on a characteristic speed $v_i$ of defects i in dielectric layer 106. This defect distribution represents a property of dielectric layer 106. This property partially determines the movement of the defects of defect type i in dielectric layer 106. The parameters decay length $\alpha$, mean effective distance $a_i$, activation energy $E_{A,0,i}$, and electric charge $N_{q,i}$ of the defects of defect type i are physical properties. The Boltzmann constant is denoted by $k_B$. The temperature of the surroundings of the observed defect, in particular the temperature in dielectric layer 106, is denoted by T.

Up to a dielectric failure, a time curve of a leakage current density $J_{TED}$ may be determined via the equation of the thermionic emission diffusion theory according to Crowell and Sze:

$$J_{TED} = \frac{q N_C v_R}{1 + \frac{v_R}{v_D}} e^{-\frac{\Phi_B^{eff}}{k_B T}} \left[ e^{\frac{qU}{k_B T}} - 1 \right]$$

In this case, q represents the unit charge, $N_C$ the effective state density in the power band, $v_R$ the effective recombination speed, $v_D$ the effective diffusion speed, $\Phi_B^{eff}$ the effective Schottky barrier, kB the Boltzmann constant, T the temperature of the surroundings, and U the voltage over dielectric layer 106.

Defects i having positive charge migrate to the electrode having negative potential and accumulate in its vicinity in the dielectric layer. Defects i having negative charge move to the electrode having positive potential and accumulate at the interface. Effective Schottky barrier $\Phi_B^{eff}$ thus changes.

A barrier height change $\Delta\Phi_i$, which is generated by defects i, is characterized by its maximum height $\delta\Phi_i$ and a characteristic time constant $\tau_i$. Characteristic time constant $\tau_i$ defines a duration in which barrier height change $\Delta\Phi_i$ changes most strongly over time t:

$$\Delta\Phi_i(t) = \delta\Phi_i\left(1 - e^{\frac{t}{\tau_i}}\right)$$

Maximum height $\delta\Phi_i$ is a function of a number $Z_i$ of defects i and is dependent on the type of the interface. The term $$\left(1 - e^{\frac{t}{\tau_i}}\right)$$

describes a static distribution of defects i in the material, in particular around the particular starting position. The starting position represents a focal point of the distribution in the example.

Time constant $\tau_i$ may be different for the movement under the influence of a first voltage U1 than for the movement under the influence of a second voltage U2. Time constant $\tau_i$ may be defined by a mobility of defects i under an influence of electrical field E in dielectric layer 106 and the path to be covered to reach the particular interface in dielectric layer 106. During the displacement in the interior of dielectric layer 106, defect type i has to cover a distance $d_i$ of the focal point of its distribution to the interface. Together with speed $v_i$, characteristic time constant $\tau_i$ results for the accumulation process of defects i in $$\tau_i = \frac{d_i}{v_i}$$

Time constant $\tau_i$ is determinable from a measurement of the leakage current over time, an evaluation of the time-dependent curve with the aid of the equations of the thermionic emission diffusion theory according to Crowell and Sze, and the time-dependent behavior of the barrier height change. Activation energy $E_{A,0,i}$ and electrical charge $N_{q,i}$ of the defects of defect type i may be determined with the aid of multiple measurements of $\tau_i$ at different temperatures T and voltages U.

During the operation of semiconductor component 100 according to the first embodiment with application of first electrical voltage U1 having a first polarity, an electrical load results. Under the electrical load, charged defects D1 of the first defect type may reach the interface. Charged defects D1 of the first defect type which reach the interface accumulate at the interface. The accumulation of charged defects at the interface at first electrode 102 during the electrical load using first electrical voltage U1 is a reversible process, in the meaning that by applying second electrical voltage U2 having a polarity opposite to the polarity of first electrical voltage U1, these charged defects D1 of the first defect type move in the opposite direction and thus move away from the interface again.

For the operation of semiconductor component 100 according to the second embodiment, the same applies to defects D1 of the first defect type. Charged defects D2 of the second defect type may moreover be movable by first electrical voltage U1 in the same direction as defects D1 of the first defect type or in the direction opposite thereto. An accumulation of defects D2 of the second defect type at the interface, which these defects seek upon application of the first electrical voltage, is also reversible in the example by applying second electrical voltage U2.

The first embodiment and the second embodiment of semiconductor component 100 are examples. Semiconductor component 100 may include more than two electrodes. Semiconductor component 100 may include more than one dielectric layer lying between each two electrodes.

In such semiconductor components, a dielectric breakthrough is possible when they are operated under application of an electrical voltage. When a dielectric breakthrough occurs, the interface is partially or completely destroyed. When a dielectric breakthrough occurs, a service life of semiconductor component 100 is shortened. The dielectric breakthrough occurs, for example, when a number of charged defects which accumulate at the interface exceeds a voltage-dependent threshold value.

Physical properties and manufacturing-specific influences on these physical properties may be influenced by an optimization of process conditions and/or a process control during manufacturing of dielectric layer 106. The service life may thus be lengthened.

A growth, growth conditions, or a material composition is influenced, for example, by the process conditions and/or the process control. An intentional or unintentional doping and/or contamination during the growth process or in following processes results, for example, due to the process conditions and/or the process control.

The service life of semiconductor component 100 is lengthened, as described hereinafter, by a change of the electrical operating conditions during operation.

This is achieved by a utilization of reversible degradation processes in dielectric layer 106 and a reversal of the electrical load direction during the active service life of semiconductor component 100.

This behavior of the charged defects is utilized in the example by an intended operation of semiconductor component 100 and by a targeted load outside the intended operation against the polarity selected in intended operation.

Therefore, for example a) The accumulation of defects or of defects of a specific defect type is entirely prevented.

b) The accumulation of defects or of defects of a specific defect type is only permitted up to a determinable degree, in the example a number of defects at the interface which is less than the threshold value.

c) The accumulation of defects or of defects of a specific defect type at the interface is reversed entirely or to a determinable degree.

An accumulation of defects at the interface is always linked to an influence on the interface and thus determines a leakage current level.

One goal of the method described hereinafter may be to prevent a dielectric breakthrough in that an accumulation greater than a critical defect density is prevented.

One goal of the method described hereinafter may be to ensure a maximum leakage current level in which an accumulation greater than a defect density corresponding to the maximum leakage current level is prevented.

An effectiveness of the method described hereinafter may be influenced and optimized by a selection of second voltage U2 for a targeted load of semiconductor component 100 or by a selection of a temperature at which the targeted load is applied.

A higher or lower temperature may be set, for example, via a heating or cooling element. An optimization exists, for example, if, due to the temperature or selected second voltage U2, the movement speed of the participating defects is such that the reversal of the accumulation takes place significantly faster than the accumulation, which is disadvantageous in particular, under operating conditions for the intended operation of semiconductor component 100.

The method is optimizable by targeted management of the operation of semiconductor component 100. A point in time for the application of second voltage U2 may be systematically selected, for example. The point in time is determined, for example, for a device which includes semiconductor component 100 and an accumulator for applying first voltage U1 in intended operation, in such a way that the point in time is during a charge cycle of the accumulator. An undesired energy consumption from the accumulator is thus prevented. The point in time may also be at intervals definable by the user of the device. The point in time defines, for example, a start of a time period in which second voltage U2 is applied. Time periods may thus be prevented in which the device is inadvertently not available for the intended operation. The point in time may be established, in particular at intervals, on the basis of an operating duration of the device and/or a load profile of the semiconductor component or the accumulator or the device.

The point in time may be when the duration of the operation using the first voltage reaches time constant $t_1$. The point in time may be before reaching time constant $t_1$. The point in time may be determined as a function of time constant $t_1$. For example, point in time z is determined as $$z = t_1 - s$$

s being a safety deduction, for example in an order of magnitude of 103 seconds.

The point in time may be adapted to the actual behavior of semiconductor component 100 by monitoring the leakage current.

The point in time, an interval, and/or a current level from which the operation is to take place using second voltage U2 is determined, for example, as a function of a deterministic curve of a leakage current degradation and in dependence on knowledge about the leakage current mechanism and the load profile.

A further implementation could be ensured by operation using first voltage U1 and second voltage U2 under time-controlled or event-controlled change of the operating polarity in particular.

For a preferred implementation of the method, the point in time or the duration is determined such that no dielectric breakthrough or high leakage current level is induced due to accumulation at the opposite interface by the operation using second voltage U2.

Figure 3:
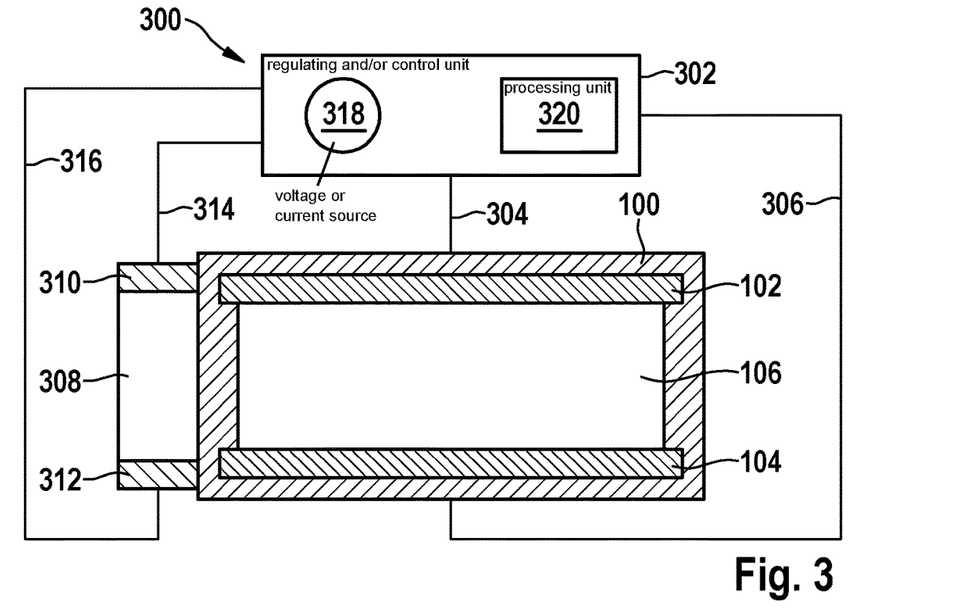
FIG. 3 shows a schematic representation of a device for activating the semiconductor component, in accordance with the present invention.

FIG. 3 shows a device 300 for activating semiconductor component 100. Semiconductor component 100 is designed in the example to drive an actuator. The actuator is in particular a MEMS, a micromirror, a print head, or a loudspeaker. The actuator is in particular not driven by semiconductor component 100 in an idle state of the device in operation using second voltage U2.

Device 300 includes a regulating and/or control unit 302, which is designed to carry out steps in a method described hereinafter for activating semiconductor component 100. Device 300 is at least temporarily connectable via a first conductor 304 to first electrode 102 of semiconductor component 100. Device 300 is at least temporarily connectable via a second conductor 306 to second electrode 104 of semiconductor component 300.

Regulating and/or control unit 302 is designed in the example to output first voltage U1 having the first polarity. First voltage U1 is applied in the example between first electrode 102 and second electrode 104 when they are connected using the particular conductor to a device 300 and regulating and/or control unit 302 outputs first voltage U1.

Regulating and/or control unit 302 is designed in the example to output second voltage U2 having the second polarity. The second polarity is opposite the first polarity in the example. Second voltage U2 is applied in the example between first electrode 102 and second electrode 104 when they are connected using the particular conductor to device 300 and regulating and/or control unit 302 outputs second voltage U2.

The control unit may be designed to output a unipolar alternating current signal for first voltage U1. A DC voltage component of first voltage U1 is, for example, in a range of 5 V to 80 V and is preferably 5 V, 10 V, or 20 V or 80 V. The AC voltage component of first voltage U1 may be less than or equal to the DC voltage component in absolute value, for example. The AC voltage component is preferably 5 V+/−3 V or 10 V+/−5 V or 20 V+/−15 V or 80 V+/−60 V.

The control unit may be designed to output an essentially constant value for second voltage U2. Second voltage U2 is greater in the example, for example, 15 V greater, than first voltage U1 in intended operation. This value is, for example, in a range of 1 V to 150 V and is preferably 2 V or −5 V or 10 V or 20 V or 40 V or 80 V or 100 V.

For continuous operation the control unit may be designed instead to output a unipolar alternating current signal for second voltage U2. The unipolar alternating current signal for second voltage U2 is, for example, the unipolar alternating current signal for first voltage U1 having opposite polarity.

Dielectric layer 106 is preferably formed as a polycrystalline oxidative high-k dielectric material.

Dielectric layer 106 is in particular formed as a PZT layer. PZT denotes $Pb(Zr_xTi_{1-x})O_3$ in this case.

Dielectric layer 106 is formed in particular as a KNN layer. KNN denotes $(K_x Na_{1-x})NbO_3$ in this case.

Dielectric layer 106 may be formed in particular as a $HfO_2$, $HfZrO_2$, $ZrO_2$, $BaTiO_3$, $SrTiO_3$, or $(Ba_xSr_{1-x})TiO_3$ layer.

Dielectric layer 106 is preferably doped. Dielectric layer 106 is, for example, a PZT layer, which is doped using nickel:

$$Pb(Zr_xTi_{1-x})O_3Ni_y.$$

Both the PZT layer and also the KNN layer may have dopants other than nickel, for example, Nb, La, Mn, Mg.

Dielectric layer 106 is preferably formed as a sputtered PZT layer. The so-called target material is deposited in a plasma on a substrate for this purpose. PZT is used as the target material, for example. The sputtered PZT layer preferably has a deposition temperature of less than 500° C. in this context.

The thickness of dielectric layer 106 is preferably in the range 500 nm to 4 μm. This is a reasonable range for actuators. The layer thickness is preferably 1 μm or 4 μm. Greater layer thicknesses are also possible. The described process may be carried out for all layer thicknesses.

Lower layer thicknesses are also possible. The thickness of the dielectric layer is preferably in the range less than 500 nm, for example, for applications outside of actuators. One example of this is an application of high-k dielectric materials, for example, as a memory. The memory may be a resistive Random Access Memory, ReRAM, or a ferroelectric Random Access Memory, FeRAM. For these other applications, thicknesses of 15 nm-200 nm are reasonable depending on the application.

In addition, very thin high-k dielectric materials including layers are usable, for example, as gate oxides in very many applications. $HfO_2$ or $SiO_2$ having a layer thickness less than or equal to 50 nm may be provided, for example, as dielectric layer 106.

The regulating unit may be designed to regulate a setpoint value for first voltage U1. This setpoint value is, for example, in a range of 1 V to 20 V.

The regulating unit may be designed to regulate a setpoint value for second voltage U2. This setpoint value is, for example, in a range of −1 V to −20 V.

In this case, a voltage measuring unit may be provided, which is designed to detect the voltage between first electrode 102 and second electrode 104. The regulating unit is designed in this case to reduce a regulating deviation, which is determined as a function of a difference of this detected voltage from the setpoint value.

Device 300 optionally includes a heating unit 308 in the example. Heating unit 308 is designed in the example to heat dielectric layer 106. Heating unit 308 may be designed as a heating coil. Heating unit 308 is situated in the example on dielectric layer 106. Heating unit 308 is situated electrically and/or electromagnetically insulated from dielectric layer 106 in the example. A corresponding arrangement on a side of one of the electrodes facing away from dielectric layer 106 is also possible.

Heating unit 308 may also be situated externally on a housing around semiconductor element 100. Dielectric layer 106 and first electrode 102 and second electrode 104 may be situated in the housing.

In the example, heating unit 308 is electrically heatable via a first contact 310 and a second contact 312.

Regulating and/or control unit 302 is at least temporarily connectable, for example, via a third conductor 314 to first contact 310 and via a fourth conductor 316 to second contact 312, in order to effect a current I1 through heating unit 308.

Regulating and/or control unit 302 is designed in the example to output current I1.

Device 300 optionally includes a voltage source or current source 318 in this example. Voltage or current source 318 may also be situated outside the device. A processing unit 320, in particular a microprocessor, which is designed to activate semiconductor component 100, is provided in regulating and/or control unit 302 in the example.

The control unit may be designed to output an essentially constant value for current I1. This value is, for example, in a range by which heating unit 308 heats the dielectric layer to a temperature between 100° C. and 200° C.

The regulating unit may be designed to regulate a setpoint value for current I1. This setpoint value is, for example, in a range by which heating unit 308 heats the dielectric layer to a temperature between 100° C. and 200° C. In this case, a temperature measuring unit may be provided which is designed to detect the temperature of dielectric layer 106. The regulating unit is designed in this case to reduce a regulating deviation, which is determined as a function of a difference of this detected temperature from the setpoint value. The temperature may also be detected at another point, for example, on the housing, of heating unit 210 or in the surroundings of dielectric layer 106. Device 300 optionally includes a current measuring unit, which is designed to detect a current that flows through first electrode 102 or second electrode 104. It may be provided that the current measuring unit detects the current that flows through first conductor 304. It may be provided that the current measuring unit detects the current that flows through second conductor 306.

Regulating and/or control unit 302 is designed to output either first voltage U1 or second voltage U2.

Regulating and/or control unit 302 may optionally be designed to output either first voltage U1 or second voltage U2 as a function of the detected current.

Figure 4:
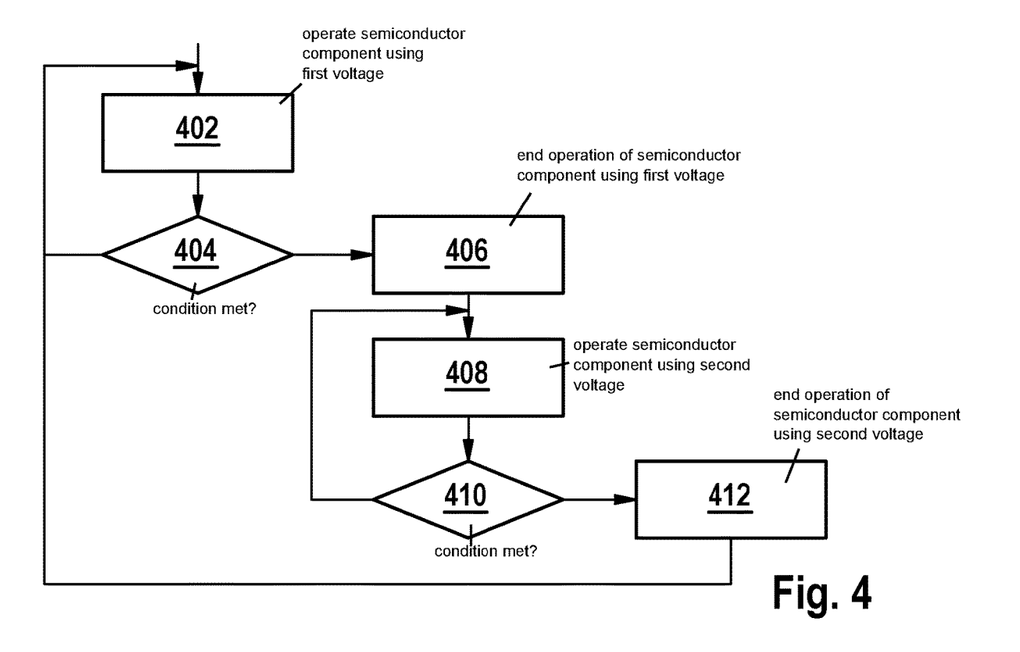
FIG. 4 shows steps in a method for use of a semiconductor component, in accordance with the present invention.

A method for using semiconductor component 100 is described hereinafter on the basis of FIG. 4. In the example, semiconductor element 100 is activated by device 300.

In a step 402, semiconductor component 100 is operated using first voltage U1 having the first polarity between first electrode 102 and second electrode 104.

Figure 5:
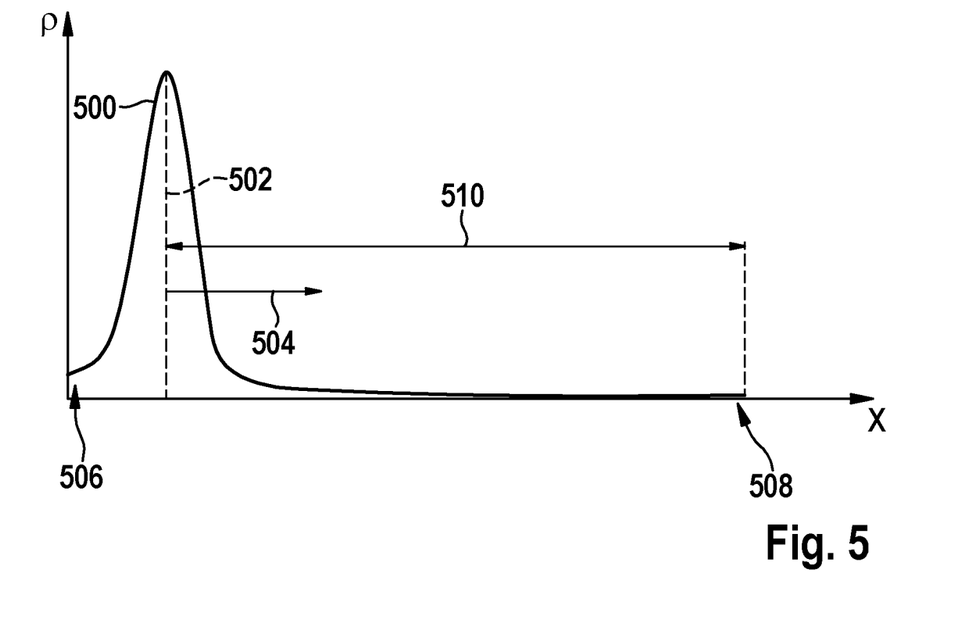
FIG. 5 shows a first density p of a distribution of defects in the semiconductor component, in accordance with the present invention.

In FIG. 5, a density p of a distribution 500 of defects D1 of the first defect type is schematically shown over a curve x of dielectric layer 106 in starting position 502, i.e., the focal point of distribution 500 at the beginning of the application of first voltage U1 in the intended operation of semiconductor component 100. Density p of defects D1 of the first defect type is greatest in starting position 502 and decreases strongly with increasing distance from starting position 502. At a location 508 of first electrode 102 and a location 506 of second electrode 104, density p goes to zero in the example. Defects D1 of the first defect type move, while first voltage U1 is applied, in direction 504 away from location 506 of second electrode 104 toward location 508 of first electrode 102. Until reaching location 508 of first electrode 102, most defects D1 of the first defect type have to cover a distance 510 between starting position 502 and location 508 of first electrode 102. A duration until most defects D1 of the first defect type have covered distance 510 is determinable as a function of a speed at which defects D1 of the first defect type move in dielectric layer 106.

In a step 404, it is determined whether a condition for switching over from the operation using first voltage U1 to operation using second voltage U2 is met. In one aspect, the condition is met when a duration of the operation of semiconductor component 100 using first voltage U1 exceeds a first limiting value. In one aspect, the condition is met when a leakage current, which flows in operation of semiconductor component 100 using first voltage U1 through first electrode 102, second electrode 104, or first conductor 302 or second conductor 304, exceeds a threshold.

Figure 6A:
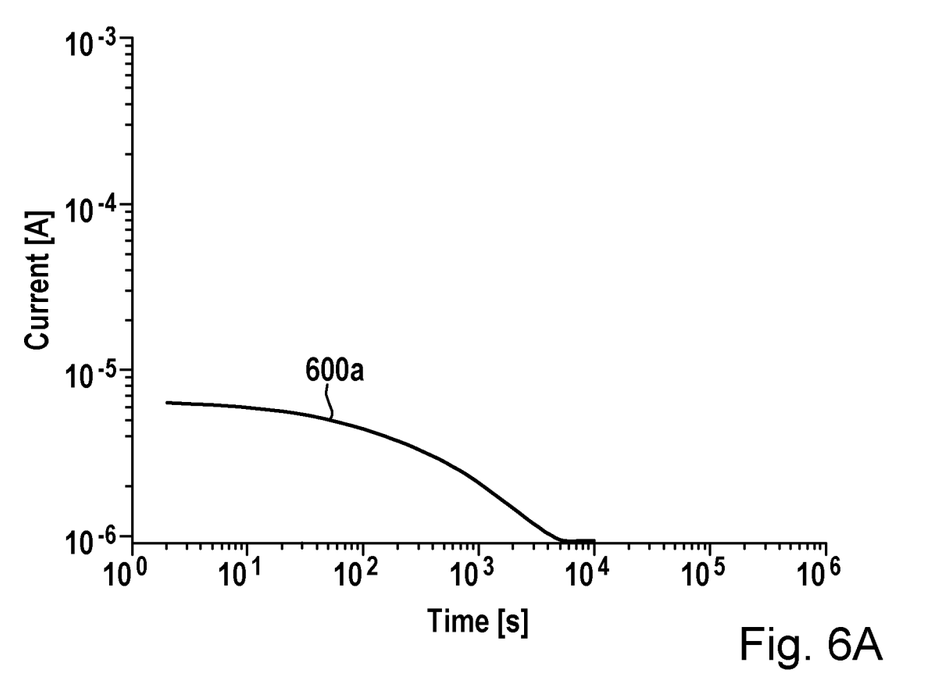
FIGS. 6A through 6D show current curves.

FIG. 6A shows a current curve 600a over time t. Current curve 600a is to be expected at a temperature of 200° C. and first voltage U1 of −5 V between first electrode 102 and second electrode 104 when the dielectric breakthrough is avoided.

Figure 6B:
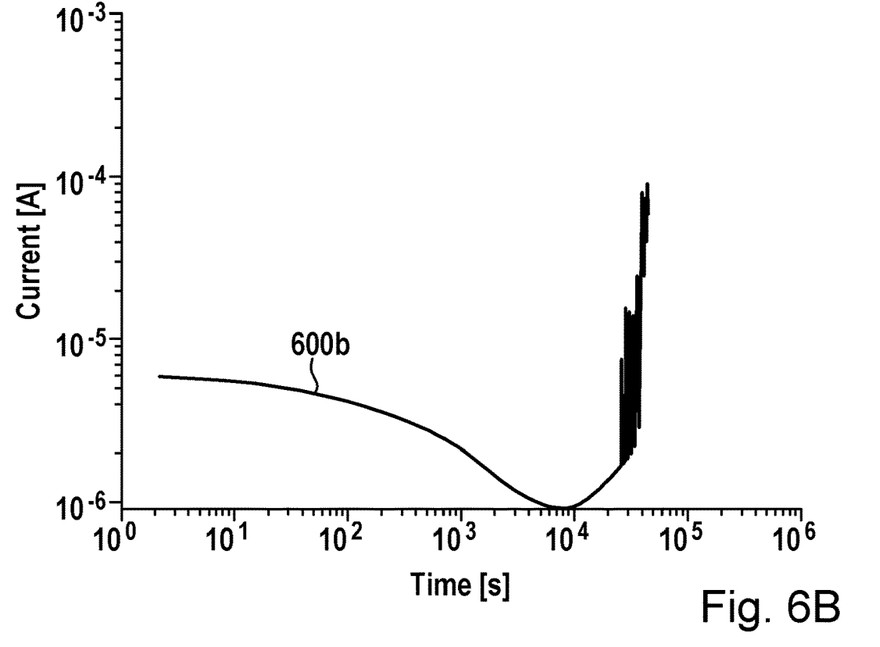

FIG. 6B shows a current curve 600b over time t. Current curve 600b is to be expected at a temperature of 200° C. and first voltage U1 of −5 V between first electrode 102 and second electrode 104 when the dielectric breakthrough is not avoided.

The first limiting value is defined by a first time period in which first voltage U1 causes a movement of defects of the first defect type from a first position in dielectric layer 106 up to a second position in dielectric layer 106 in the direction toward first electrode 102.

The first limiting value is selected to be shorter in one aspect than the duration until most defects D1 of the first defect type have covered distance 510, in order to reduce a number of defects D1 of the first defect type which accumulate at the interface at first electrode 102.

A time of $1*10^4$ seconds is selected for the first limiting value, for example.

If the condition is met, a step 406 is carried out. Otherwise, step 402 is carried out.

In step 406, the operation of semiconductor component 100 using first voltage U1 is ended.

A step 408 is then carried out.

In step 408, semiconductor component 100 is operated using second voltage U2 between first electrode 102 and second electrode 104.

A reversion process is thus initiated.

Figure 7:
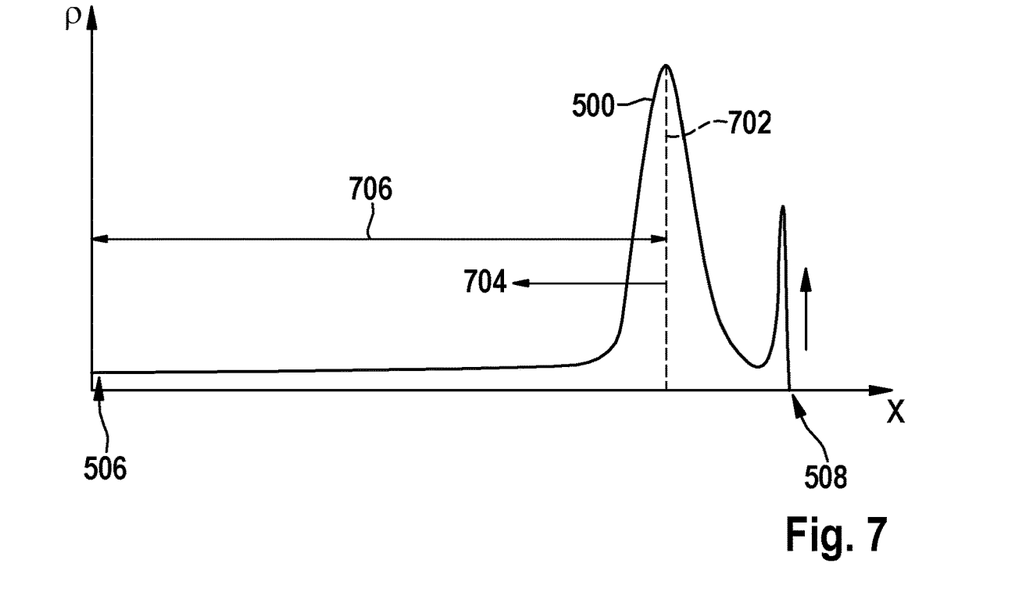
FIG. 7 shows a second density p of the distribution of defects in the semiconductor component, in accordance with the present invention.

FIG. 7 schematically shows density p of distribution 500 of defects D1 of the first defect type over curve x of dielectric layer 106 at the beginning of the application of second voltage U2. Density p of defects D1 of the first defect type is greatest in a position 702, i.e., the focal point of distribution 500, and decreases strongly with increasing distance from position 702. At location 508 of first electrode 102, density p increases strongly in the example. Defects D1 of the first defect type accumulated in operation of semiconductor component 100 using first voltage U1 are accumulated there. At location 506 of second electrode 104, density p goes to zero in the example.

Defects D1 of the first defect type move while second voltage U2 is applied in direction 704 away from location 508 of first electrode 102 toward location 506 of second electrode 104. Until reaching location 506 of second electrode 104, most defects D1 of the first defect type have to cover a distance 706 between position 702 and location 506 of second electrode 104. A duration until most defects D1 of the first defect type have covered this distance 706 is determinable as a function of a speed at which defects D1 of the first defect type move in dielectric layer 106. This speed is settable as a function of a temperature and second voltage U2. In the example, the temperature is maintained unchanged.

A step 410 is then carried out.

In step 410 it is determined whether or not a condition for switching over from operating semiconductor component 100 using the second voltage to operating semiconductor component 100 using the first voltage is met.

The condition for switching over from operating semiconductor component 100 using second voltage U2 to operating semiconductor component 100 using the first voltage is met if the leakage current falls below or exceeds a threshold depending on the case. In many applications, the leakage current falls below the threshold when switching is to take place. However, a precisely opposite variant is also possible.

Figure 6C:
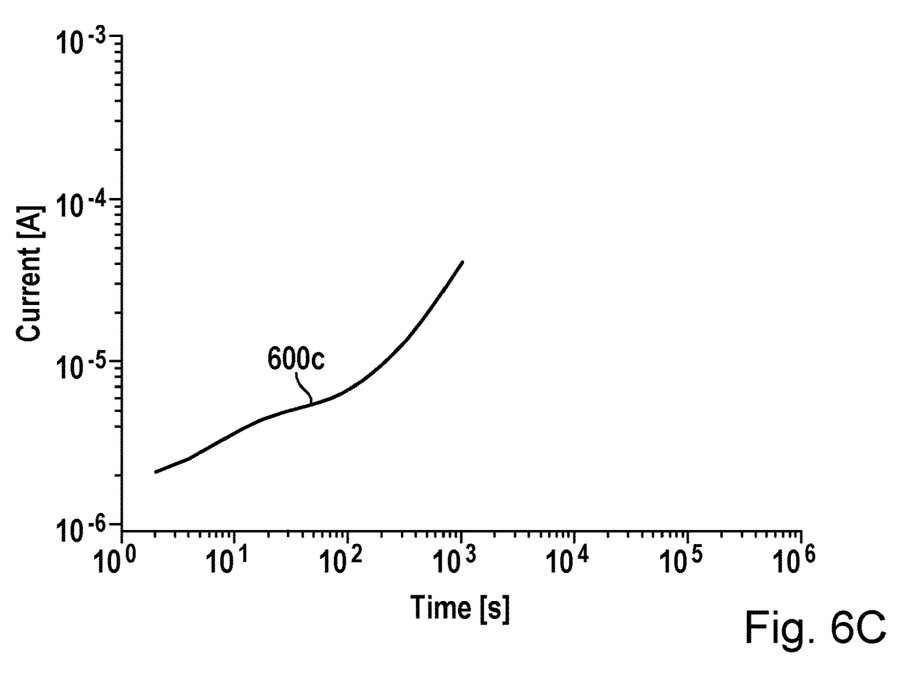

FIG. 6C shows a current curve 600c in the reversion process over time t. Current curve 600c is to be expected at a temperature of 200° C. and second voltage U2 of +20 V between first electrode 102 and second electrode 104 when the dielectric breakthrough is avoided.

Figure 6D:
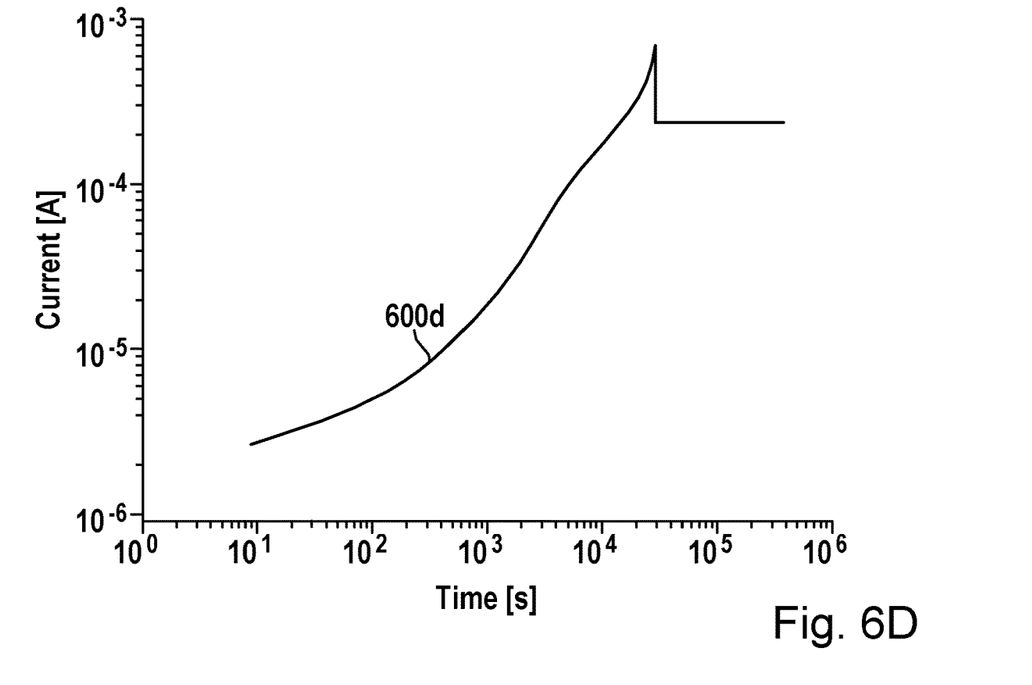

FIG. 6D shows a current curve 600d over time t. Current curve 600d is to be expected at a temperature of 200° C. and second voltage U2 of +20 V between first electrode 102 and second electrode 104 when the dielectric breakthrough is not avoided. For example, a duration of the operation of semiconductor component 100 using second voltage U2 is determined. The condition is met, for example, if the duration exceeds a second limiting value. The second limiting value is determined in the example as a function of second voltage U2 in such a way that most defects D1 of the first defect type do not overcome distance 706. The temperature at semiconductor component 100 or dielectric layer 106 may also be taken into consideration in order to determine the second limiting value. In the example, the second limiting value of 103 seconds is selected.

The second limiting value is defined in the example by a second time period, in which second voltage U2 causes a movement of most defects D1 of the first defect type from position 702 into starting position 502. An original density p of distribution 500 of defects D1 of the first defect type is reestablished by this complete reversion process.

Figure 8:
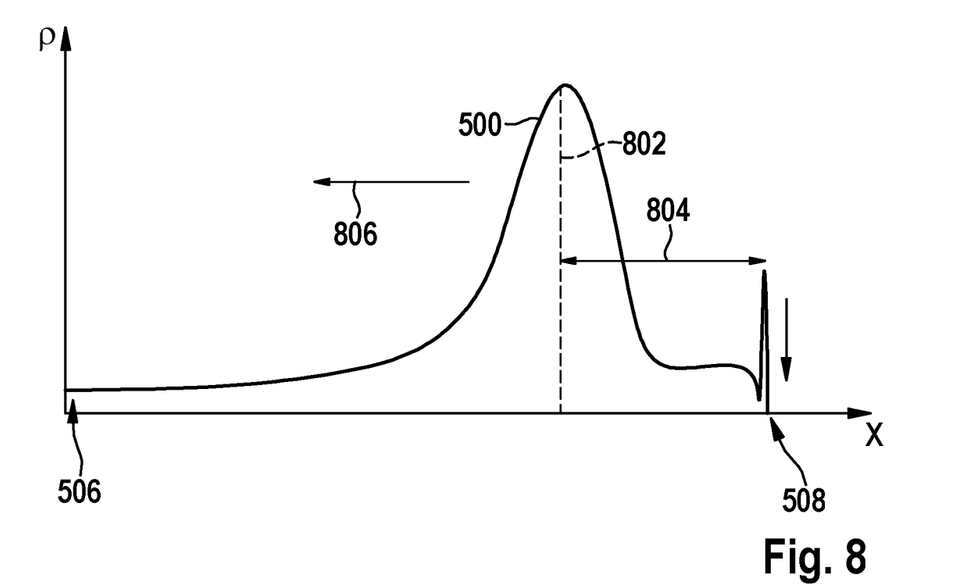
FIG. 8 shows a third density p of the distribution of defects in the semiconductor component, in accordance with the present invention.

The second limiting value may also be defined by a second time period, in which second voltage U2 causes a movement of most defects D1 of the first defect type from position 702 into another position 802 in the dielectric layer in the direction toward second electrode 106. The focal point of distribution 500 is at other position 802 in this case.

Other position 802 is closer in the example to position 702 than starting position 502. The reversion process is thus not carried out up to original starting position 502. The duration of the reversion process is thus shortened.

FIG. 8 schematically shows density p of distribution 500 of defects D1 of the first defect type over curve x of dielectric layer 106 for this case. Density p of defects D1 of the first defect type is greatest in position 802 and decreases strongly with increasing distance from position 802. At location 508 of first electrode 102, density p increases in the example. Defects D1 of the first defect type accumulated in operation of semiconductor component 100 using first voltage U1 are accumulated there, which have not yet been removed from the interface by the operation using second voltage U2. The number of defects D1 of the first defect type which are still accumulated in the interface is reduced in relation to the number which were accumulated at the beginning of the operation using second voltage U2. At location 506 of second electrode 104, density p goes to zero in the example. Defects D1 of the first defect type move while second voltage U2 is applied in direction 806 away from location 508 of first electrode 102 toward location 506 of second electrode 104 until most defects D1 of the first defect type have reached a distance 804 from location 508 of first electrode 102.

In another aspect, a leakage current which flows in operation of semiconductor component 100 using the first voltage is determined. The condition is met in this aspect when the leakage current falls below a threshold.

If the condition is met, a step 412 is carried out. Otherwise, step 408 is carried out In step 412, the operation of semiconductor component 100 using second voltage U2 is ended.

Step 402 is then carried out.

Semiconductor component 100 may thus be operated as long as possible.

Semiconductor component 100 may be heated during the operation of semiconductor component 100 using second voltage U2. The heating may take place continuously during the operation using second voltage U2. The heating may take place with interruptions during the operation using second voltage U2. The heating may take place for a shorter time period than the operation using the second voltage.

Semiconductor component 100 may be heated in particular to a temperature of 200° C. during the operation of semiconductor component using second voltage U2.

Semiconductor component 100 may be heated during the operation of the semiconductor component using second voltage U2 to a temperature which is higher than a temperature of semiconductor component 100 during the operation of the semiconductor component using first voltage U1.

Semiconductor component 100 may be operated using a second voltage U2 higher than first voltage U1.

If dielectric layer 106 includes defects D2 of the second defect type, the method may provide that their movement in dielectric layer 106 or their positions are taken into consideration in the determination of the limiting values for the durations or in the determination of the thresholds for the leakage currents.

In one aspect, the limiting value for the duration is determined in such a way that defects D2 of the second defect type are moved into a predefined position in dielectric layer 106. In one aspect, the limiting value for the duration is determined in such a way that defects D2 of the second defect type do not accumulate at the interface. The limiting value may be selected so that most defects D2 of the second defect type do not accumulate in the interface, it not being precluded that some defects D2 of the second defect type, i.e., fewer in relation thereto, accumulate in the interface. In one aspect, the limiting value for the duration is determined in such a way that defects D2 of the second defect type accumulate in the interface. The limiting value may be selected such that most defects D2 of the second defect type accumulate in the interface, it not being precluded that some defects D2 of the second defect type, i.e., fewer in relation thereto, do not accumulate in the interface.

What is claimed is:

1. A method for using a semiconductor component in which a dielectric layer is situated between a first electrode and a second electrode of the semiconductor component, defects of a first defect type being present in the dielectric layer, the method comprising the following steps:
    operating the semiconductor component using a first voltage having a first polarity between the first electrode and the second electrode;
    determining whether or not a condition is met for switching over from operating the semiconductor component using the first voltage to operating the semiconductor component using a second voltage, which has a second polarity opposite the first polarity;
    continuing the operation of the semiconductor component using the first voltage when the condition is not met; and
    when the condition is met, ending the operation of the semiconductor component using the first voltage, and operating the semiconductor component using the second voltage between the first electrode and the second electrode.

2. The method as recited in claim 1, further comprising:
    determining whether or not a condition is met for switching over from operating the semiconductor component using the second voltage to operating the semiconductor component using the first voltage;
    continuing the operation of the semiconductor component using the second voltage if the condition is not met for switching over from operating the semiconductor component using the second voltage to operating the semiconductor component using the first voltage; and
    when the condition is met for switching over from operating the semiconductor component using the second voltage to operating the semiconductor component using the first voltage, ending the operation of the semiconductor component using the second voltage, and operating the semiconductor component using the first voltage between the first electrode and the second electrode.

3. The method as recited in claim 2, wherein a duration of the operation of the semiconductor component using the second voltage is determined, the condition for switching over from operating the semiconductor component using the second voltage to operating the semiconductor component using the first voltage being met when the duration exceeds a limiting value, which is defined by a time period in which the second voltage causes a movement of defects of the first defect type in a predefined position in the dielectric layer in a direction toward the second electrode.

4. The method as recited in claim 2, wherein a leakage current when operating the semiconductor component using the second voltage is determined, the condition for switching over from operating the semiconductor component using the second voltage to operating the semiconductor component using the first voltage being met when the leakage current exceeds or falls below a threshold.

5. The method as recited in claim 1, wherein a duration of the operation of the semiconductor component using the first voltage is determined, the condition for switching over from operating the semiconductor component using the first voltage to operating the semiconductor component using the second voltage being met when the duration exceeds a limiting value.

6. The method as recited in claim 1, wherein a leakage current which flows in operation of the semiconductor component using the first voltage is determined, the condition for switching over from operating the semiconductor component using the first voltage to operating the semiconductor component using the second voltage being met when the leakage current exceeds a threshold.

7. The method as recited in claim 1, wherein the semiconductor component is heated when operating the semiconductor component using the second voltage.

8. The method as recited in claim 7, wherein the semiconductor component is heated when operating the semiconductor component using the second voltage to a temperature which is higher than a temperature of the semiconductor component when operating the semiconductor component using the first voltage.

9. The method as recited in claim 7, wherein the semiconductor component is heated when operating the semiconductor component using the second voltage to a temperature in a range of 100° C. to 250° C.

10. The method as recited in claim 7, wherein the semiconductor component is heated when operating the semiconductor component using the second voltage to a temperature in a range of 150° C. or 200° C.

11. The method as recited in claim 1, wherein the semiconductor component, in operation using the first voltage, drives an actuator, the actuator not being driven by the semiconductor component in operation using the second voltage.

12. The method as recited in claim 11, wherein the actuator is of a MEMS or a micromirror or a print head or a loudspeaker.

13. The method as recited in claim 1, wherein the semiconductor component is operated using a second voltage higher than the first voltage.

14. A device, comprising:
    a semiconductor component which includes a dielectric layer between a first electrode and a second electrode of the semiconductor component, defects of a first defect type being present in the dielectric layer; and
    a regulating unit, wherein the regulating unit includes a microprocessor programmed to execute a method, the method comprising:

operating the semiconductor component using a first voltage having a first polarity between the first electrode and the second electrode;

determining whether or not a condition is met for switching over from operating the semiconductor component using the first voltage to operating the semiconductor component using a second voltage, which has a second polarity opposite the first polarity;

continuing the operation of the semiconductor component using the first voltage when the condition is not met; and when the condition is met, ending the operation of the semiconductor component using the first voltage, and operating the semiconductor component using the second voltage between the first electrode and the second electrode.

15. The device as recited in claim 14, wherein the dielectric layer includes defects of at least one further defect type, which are able to move, upon application of the first voltage, in a direction toward the second electrode.

* * * * *